(12) United States Patent
Ikushima

(10) Patent No.: US 9,440,781 B2
(45) Date of Patent: Sep. 13, 2016

(54) DROPLET DISCHARGE DEVICE AND METHOD

(75) Inventor: Kazumasa Ikushima, Mitaka (JP)

(73) Assignee: MUSASHI ENGINEERING, INC., Tokyo (JP)

( * ) Notice: Subject to any disclaimer, the term of this patent is extended or adjusted under 35 U.S.C. 154(b) by 0 days.

(21) Appl. No.: 14/232,186

(22) PCT Filed: Jul. 10, 2012

(86) PCT No.: PCT/JP2012/067527
§ 371 (c)(1),
(2), (4) Date: Mar. 11, 2014

(87) PCT Pub. No.: WO2013/008799
PCT Pub. Date: Jan. 17, 2013

(65) Prior Publication Data
US 2014/0217127 A1    Aug. 7, 2014

(30) Foreign Application Priority Data
Jul. 11, 2011    (JP) .................................. 2011-152594

(51) Int. Cl.
*G01F 11/00* (2006.01)
*B65D 83/00* (2006.01)
(Continued)

(52) U.S. Cl.
CPC ......... *B65D 83/0022* (2013.01); *B05C 5/0225* (2013.01); *B41J 2/04* (2013.01);
(Continued)

(58) Field of Classification Search
CPC .......... B41J 2/04; B41J 2202/05; B41J 2/14; B65D 83/0022; H05K 2203/0126; H05K 3/1241; H05K 3/0091; B05C 5/0225

USPC ......... 222/420, 571, 309, 504, 518, 61, 389, 222/399, 340, 1
See application file for complete search history.

(56) References Cited

U.S. PATENT DOCUMENTS 4,942,984 A * 7/1990 Miller ........................... 222/309
5,356,034 A    10/1994 Schlumberger
(Continued)

FOREIGN PATENT DOCUMENTS

| | | |
|---|---|---|
| CN | 1248783 C | 4/2006 |
| JP | 3-254851 A | 11/1991 |

(Continued)

OTHER PUBLICATIONS

International Search Report dated Oct. 23, 2012 issued in corresponding application No. PCT/JP2012/067527.
(Continued)

*Primary Examiner* — Kevin P Shaver
*Assistant Examiner* — Robert Nichols, II
(74) *Attorney, Agent, or Firm* — Westerman, Hattori, Daniels & Adrian, LLP

(57) ABSTRACT

An example of droplet discharge device includes a discharge path (12) having an end that constitutes a discharge opening (11), a plunger (30), a liquid chamber (50) into which the plunger (30) is inserted, a plunger driving mechanism that moves the plunger (30) forward and backward, and a plunger position determining mechanism that specifies a position of a tip portion of the plunger (30). The liquid material is discharged in a droplet state by applying inertial force to the liquid material with forward movement of the plunger (30) in a state where the tip portion of the plunger (30) and an inner wall of the liquid chamber (50) are not contacted with each other. A minute droplet is formed by moving the plunger (30) forward to push the liquid material out of the discharge opening (11) in an amount necessary to form a droplet of a desired size.

22 Claims, 3 Drawing Sheets

(51) Int. Cl.
*B41J 2/04* (2006.01)
*H05K 3/00* (2006.01)
*H05K 3/12* (2006.01)
*B05C 5/02* (2006.01)
*B41J 2/14* (2006.01)

(52) U.S. Cl.
CPC .............. *B41J 2/14* (2013.01); *H05K 3/0091* (2013.01); *H05K 3/1241* (2013.01); *B41J 2202/05* (2013.01); *H05K 2203/0126* (2013.01)

(56) References Cited

U.S. PATENT DOCUMENTS

| | | | |
|---|---|---|---|
| 6,253,957 B1 * | 7/2001 | Messerly et al. | 222/1 |
| 8,708,246 B2 * | 4/2014 | Dunlap et al. | 239/1 |
| 2004/0134996 A1 | 7/2004 | Kazumasa | |
| 2010/0294810 A1 * | 11/2010 | Ikushima | 222/420 |

FOREIGN PATENT DOCUMENTS

| | | |
|---|---|---|
| JP | 5-264412 A | 10/1993 |
| JP | 10-314640 A | 12/1998 |
| JP | 2009-018587 A | 1/2009 |
| JP | 2011-031181 A | 2/2011 |
| WO | 98/10251 A1 | 3/1998 |
| WO | 98/16323 A1 | 4/1998 |
| WO | 2008/108097 A1 | 9/2008 |

OTHER PUBLICATIONS

Office Action dated Aug. 13, 2015, issued in counterpart Chinese application No. 201280034714.3 (w/English translation) (4 pages).
Japanese Office Action dated Jul. 6, 2016, issued in counterpart Japanese application No. 2015-175324. (5 pages).

* cited by examiner (a) (b) (c) (d)

(e) (f) (g) (h)

(a)    (b)

DROPLET DISCHARGE DEVICE AND METHOD

TECHNICAL FIELD

The present invention relates to a droplet discharge device and method for high-accurately discharging a minute amount of liquid material ranging from a low-viscosity material, such as water, a solvent or a reagent, to a high-viscosity material, such as a solder paste, a silver paste or an adhesive, regardless of whether the liquid material contains filler or not.

BACKGROUND ART

Various techniques have hitherto been proposed in relation to a droplet discharge device for discharging a small amount of liquid material from a discharge opening by using a plunger that is moved reciprocally.

As an example of a droplet discharge device of the type hitting a tip of a plunger against a valve seat to discharge a liquid material in a droplet state, Patent Document 1 discloses a droplet discharge device for causing the liquid material to land on a workpiece after a droplet has departed from a nozzle, wherein a plunger is disposed in a flow path including a valve seat near an outlet of the flow path, the outlet communicating with the nozzle, such that a lateral surface of the plunger is not contacted with an inner wall of the flow path, and the tip of the plunger is moved toward the valve seat and is hit against the valve seat, thereby discharging the liquid material in the droplet state from the nozzle.

However, hitting the plunger against the valve seat raises the problems that the shape of the plunger is changed due to wear, and that wear dust or wear debris generates and contaminates the liquid material, or comes into a gap between the plunger and the valve seat, whereby satisfactory discharge is impeded.

In view of those problems, the applicant has proposed, as a droplet discharge device of the type discharging the liquid material without hitting the tip of the plunger against the valve seat, a droplet discharge device for discharging the liquid material in the droplet state by applying inertial force to the liquid material with operations of moving the plunger forward and stopping the forward movement of the plunger, wherein the device includes a plunger position determining mechanism that specifies a position of the tip of the plunger upon the stop of the forward movement to be held near an inner wall of a liquid chamber, which is located ahead in an advancing direction of the plunger (see Patent Document 2).

Furthermore, Patent Document 3 discloses a fluid droplet applying apparatus in which a pressure wave is formed by displacing an end surface of a rod forward and backward inside a chamber through a very small stroke with high acceleration and large force by employing a drive device, and the pressure wave is propagated through a material in the chamber, thus causing the material to be discharged from a nozzle opening.

Meanwhile, with further reduction in size and weight of electronic equipment, reduction in size and weight of electronic components incorporated in the electronic equipment has also been progressed in recent years. For instance, a component having mount dimensions of 400 μm×200 μm, called the "0402 component", which can greatly reduce a mount area, has been practically mounted since about 2005. The 0402 component is mounted by solder printing using a metal plate at present. However, there is a problem of requiring a contrivance, such as half-etching, in a situation where the 0402 component is present together with large-sized components. Another problem is that a coating amount (coating thickness) has to be controlled individually. For that reason, the mounting with the printing is poor in yield. Moreover, component layout is limited in some cases when good printing performance is to be ensured.

In the droplet discharge device using the plunger that is moved reciprocally, the above-mentioned problems are not caused because the liquid material can be controlled with the operation of the plunger. In that type of device, however, there is not yet realized a technique of high-accurately discharging a droplet of a liquid, such as a solder paste, in a minute volume (e.g., several tens to several hundreds μm in terms of a diameter of the landed droplet), which is required for a small-sized component, without contacting the plunger with the valve seat.

LIST OF PRIOR-ART DOCUMENTS

Patent Documents

Patent Document 1: International Publication Pamphlet WO 98/10251
Patent Document 2: International Publication Pamphlet WO 2008/108097
Patent Document 3: International Publication Pamphlet WO 98/16323

SUMMARY OF THE INVENTION

Problems to be Solved by the Invention

The present invention is intended to high-accurately discharge a minute droplet in a droplet discharge device, which employs a reciprocally moving plunger, without contacting the plunger with an inner wall of a liquid chamber (valve seat).

The present invention is further intended to discharge various types of liquids ranging from a low-viscosity liquid to a high-viscosity liquid in the same droplet discharge device.

Means for Solving the Problems

According to a first aspect of the present invention, there is provided a droplet discharge device comprising a discharge path having an end that constitutes a discharge opening, a plunger, a liquid chamber into which the plunger is inserted, a plunger driving mechanism that moves the plunger forward and backward, and a plunger position determining mechanism that specifies a position of a tip portion of the plunger, the liquid material being discharged in a droplet state by applying inertial force to the liquid material with forward movement of the plunger in a state where the tip portion of the plunger and an inner wall of the liquid chamber are not contacted with each other, wherein a minute droplet is formed by moving the plunger forward to push the liquid material out of the discharge opening in an amount necessary to form a droplet of a desired size, and then by moving the plunger backward to divide the liquid material having been pushed out of the discharge opening.

According to a second aspect of the present invention, in the invention according to the first aspect, the discharge path includes a first flow path having an end that constitutes the discharge opening, and a second flow path, which is communicated with the first flow path and the liquid chamber and which has a larger diameter than the first flow path.

According to a third aspect of the present invention, in the invention according to the second aspect, after moving the plunger backward and dividing the liquid material having been pushed out of the discharge opening, the plunger is further moved backward to form an air-liquid interface in the first flow path or the second flow path, and the movement of the plunger is then stopped.

According to a fourth aspect of the present invention, in the invention according to the first aspect, after moving the plunger backward and dividing the liquid material having been pushed out of the discharge opening, the plunger is further moved backward to form an air-liquid interface in the discharge path, and the movement of the plunger is then stopped.

According to a fifth aspect of the present invention, in the invention according to the third or fourth aspect, the minute droplet is successively formed by moving the plunger forward from a plunger position, which is given after forming the air-liquid interface in the discharge path and stopping the movement of the plunger, to push the liquid material out of the discharge opening in an amount necessary to form a droplet of a desired size, and then by moving the plunger backward to divide the liquid material having been pushed out of the discharge opening.

According to a sixth aspect of the present invention, in the invention according to any one of the first to fifth aspects, an inner diameter of the discharge opening is several tens μm or less.

According to a seventh aspect of the present invention, there is provided a droplet discharge method for discharging a liquid material in a droplet state by applying inertial force to the liquid material with forward movement of a plunger in a state where a tip portion of the plunger and an inner wall of a liquid chamber are not contacted with each other, by employing a droplet discharge device comprising a discharge path having an end that constitutes a discharge opening, the plunger, the liquid chamber into which the plunger is inserted, a plunger driving mechanism that moves the plunger forward and backward, and a plunger position determining mechanism that specifies a position of the tip portion of the plunger, wherein the droplet discharge method includes a pushing step of moving the plunger forward to push the liquid material out of the discharge opening in an amount necessary to form a droplet of a desired size, and a dividing step of moving the plunger backward to divide the liquid material having been pushed out of the discharge opening, to thereby form the minute droplet.

According to an eighth aspect of the present invention, in the invention according to the seventh aspect, the droplet discharge method further includes a sucking step of, after the dividing step, further moving the plunger backward to form an air-liquid interface in the discharge path, and then stopping the movement of the plunger.

According to a ninth aspect of the present invention, in the invention according to the seventh or eighth aspect, the liquid material is a liquid material containing a solid substance, and a distance between the tip portion of the plunger and the inner wall of the liquid chamber in the pushing step is set larger than the solid substance.

According to a tenth aspect of the present invention, in the invention according to any one of the seventh to ninth aspects, an inner diameter of the discharge opening is several tens μm or less.

According to an eleventh aspect of the present invention, in the invention according to any one of the seventh to tenth aspects, the liquid material has viscosity of 10000 mPa·s or more.

According to a twelfth aspect of the present invention, in the invention according to any one of the seventh to eleventh aspects, a forward movement distance of the plunger in the pushing step is larger than a distance between the tip portion of the plunger and the inner wall of the liquid chamber immediately after the pushing step. In this respect, the forward movement distance of the plunger in the pushing step is set to be preferably 3 times or more, more preferably 6 times or more, and even more preferably 10 times or more the distance between the tip portion of the plunger and the inner wall of the liquid chamber immediately after the pushing step.

Advantageous Effect of the Invention

According to the present invention, the droplet can be high-accurately discharged in a minute volume at which it has so far been impossible to discharge the droplet without contacting the plunger (valve body) with the inner wall of the liquid chamber (valve seat).

Furthermore, since the valve body and the valve seat are not contacted with each other, friction debris or particles are not generated and hence not mixed into the liquid material. Accordingly, contamination-free discharge of the liquid material in a minute amount can be realized.

In addition, even when the liquid material contains a solid substance, e.g., filler, reduction of discharge accuracy caused by collapse or breakage of the solid substance is avoided, and the discharge can be performed without impairing the function and the properties of the liquid material.

BRIEF DESCRIPTION OF THE DRAWINGS

FIG. 1(a) illustrates a first stage, FIG. 1(b) illustrates a second stage, FIG. 1(c) illustrates a third stage, FIG. 1(d) illustrates a fourth stage, FIG. 1(e) illustrates a fifth stage, FIG. 1(f) illustrates a sixth stage, FIG. 1(g) illustrates a seventh stage, and FIG. 1(h) illustrates an eighth stage.

FIG. 2(a) illustrates a first modification example, FIG. 2(b) illustrates a second modification example, FIG. 2(c) illustrates a third modification example, FIG. 2(d) illustrates a fourth modification example, FIG. 2(e) illustrates a fifth modification example, FIG. 2(f) illustrates a sixth modification example, FIG. 2(g) illustrates a seventh modification example, and FIG. 2(h) illustrates an eighth modification example.

FIG. 3(a) illustrates a state where a movable member is moved forward, and FIG. 3(b) illustrates a state where the movable member is moved backward.

MODE FOR CARRYING OUT THE INVENTION

The present invention relates to a technique of discharging a liquid material from a discharge opening at an end of a discharge path, formed to extend in an advancing direction of a plunger, with forward and backward movement of the plunger, which is inserted through an insertion hole communicating with a liquid chamber and which is moved forward and backward in a state where a tip of the plunger is not contacted with an inner wall of the liquid chamber. With the technique of the present invention, various types of liquid materials ranging from a low-viscosity material to a high-viscosity material can be high-accuratedly discharged in a minute amount from the discharge opening in a droplet state regardless of whether the liquid material contains filler no not.

According to the present invention, the liquid material ranging from a low-viscosity material, such as water, a solvent, or a reagent, to a high-viscosity material, such as a solder paste, a silver paste or an adhesive can be discharged in a minute amount. The present invention is featured in that it can be applied to a high-viscosity liquid having high viscosity, such as solder cream, which is not suitable for discharge with an ink jet type device. Here, the term "high-viscosity liquid" implies a liquid having viscosity of 10000 to 500000 mPa·s, for example. A technique of discharging a minute amount of liquid having viscosity of 20000 mPa·s to 500000 mPa·s, particularly a liquid having viscosity of 30000 mPa·s to 500000 mPa·s, in a droplet state without contacting the plunger (valve body) with the inner wall of a liquid chamber (valve seat) has not been realized at an industrial level up to date.

The term "discharge in a minute amount" used in the present invention implies discharge of a droplet landed at a diameter of several tens to several hundreds μm, for example, or a droplet having a volume of 1 nl or less (preferably 0.1 to 0.5 nl or less). The present invention is featured in that a droplet can be formed even with the discharge opening having a diameter of several tens μm or less (preferably 30 μm or less).

One embodiment for carrying out the present invention will be described below with reference to FIG. 1.

Figure 1:
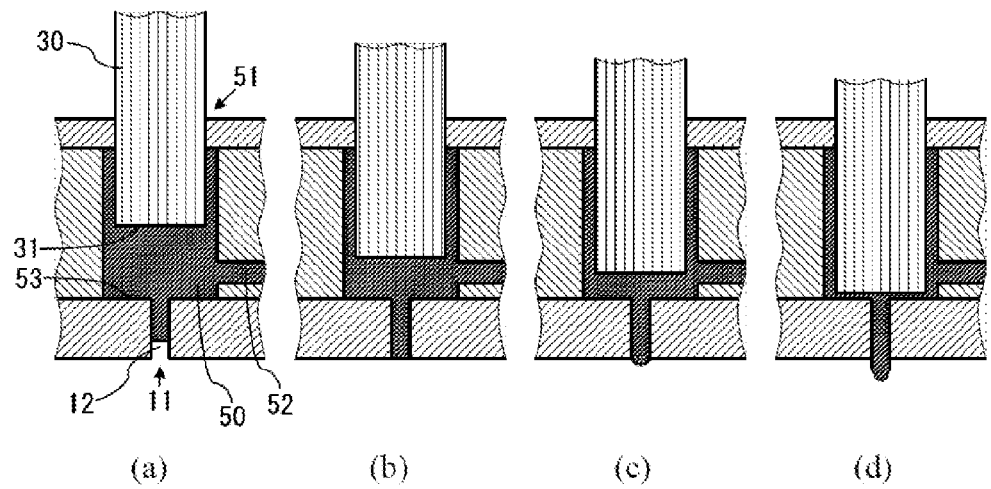
FIG. 1 is a side sectional view of principal part of a droplet discharge device to explain the relation between a position of a plunger and a state of a liquid material. More specifically.
Figure 1:
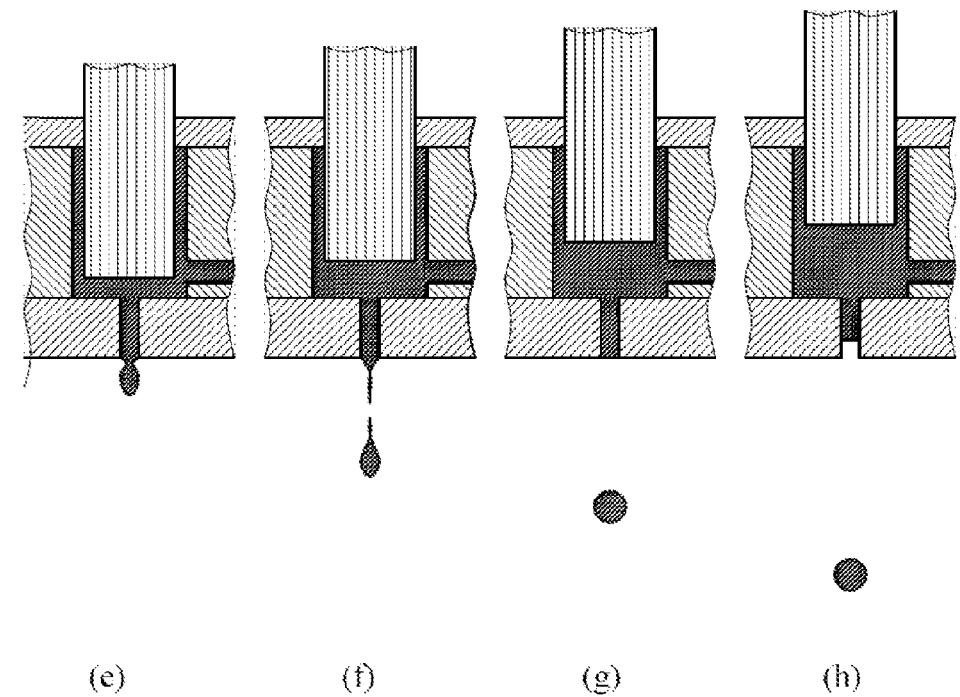

FIG. 1 is a side sectional view of principal part of a droplet discharge device (dispenser). The structure of the principal part (discharge unit) of the droplet discharge device is first described.

The discharge unit illustrated in FIG. 1 includes a plunger 30, a liquid chamber 50, an insertion hole 51, a liquid feed path 52, and a discharge path 12.

The liquid chamber 50 is a space in which a tip portion 31 of the plunger is positioned and which is filled with a liquid material. The liquid chamber 50, illustrated in FIG. 1, is formed in a cylindrical shape, and it has an upper surface, a lateral surface, and a bottom surface.

The insertion hole 51 is formed in the upper surface of the liquid chamber 50. The plunger 30 is inserted through the insertion hole 51, and a tip of the plunger 30 is positioned inside the liquid chamber 50. A width (diameter) of the liquid chamber 50 is larger than a width (diameter) of the plunger 30, and an outer periphery of the plunger 30 and the lateral surface of the liquid chamber 50 are always held in a noncontact state. The plunger 30 is connected to a plunger driving mechanism (not illustrated) such that the plunger 30 is linearly moved toward the discharge path 12 or away from the discharge path 12. While the tip portion 31 has a flat shape in FIG. 1, the shape of the tip portion 31 is not limited to the illustrated one. For example, the tip portion 31 may have a spherical, concave, or tapered shape. As an alternative, the tip portion 31 may include a projection at a position facing the discharge path 12. FIGS. 2(a) to 2(g) illustrate, by way of example, modified shapes of the tip portion 31 of the plunger.

The liquid feed path 52 is connected to the lateral surface of the liquid chamber 50. The liquid material is supplied to the liquid chamber 50 from a liquid material supply unit (not illustrated), such as a liquid material reservoir, through the liquid feed path 52.

The discharge path 12 communicating with the outside is connected to the bottom surface of the liquid chamber 50. With the plunger moving forward, the liquid material is discharged to the outside from the discharge opening 11 at the end of the discharge path 12. The discharge opening 11 has an inner diameter of 10 to 100 μm, for example. The discharge path 12 is not limited to a cylindrical shape, and it may be formed in a tapered shape gradually thinning toward the end (see FIGS. 2(e) and 2(g)). The discharge path 12 may be constituted by a first flow path 21 including the discharge opening, and a second flow path 22 having a larger diameter than the first flow path (see FIG. 2(f)). In such a case, the second flow path 22 may be formed in a truncated conical shape (see FIGS. 2(a) to 2(d)). When the discharge path has a larger diameter on the side closer to the liquid chamber than on the side closer to the discharge opening, the discharge path provides an effect of accelerating the liquid material that has entered the discharge path.

If the discharge path is too long, the droplet is not satisfactorily divided in some cases. Such a problem tends to occur particularly in the case of the liquid material having high viscosity. For that reason, the discharge path 12 is preferably formed as an orifice that is provided by boring a wall surface 53 of the liquid chamber. The length of the discharge path is set to be 100 μm to 1000 μm, for example. As an alternative, a recess having a larger diameter than the plunger 30 may be formed in the wall surface 53 of the liquid chamber, and a recess surface facing the tip portion 31 of the plunger may be formed at a position closer to the discharge opening than in the above-mentioned configurations. In such a case, a portion from the recess surface facing the tip portion 31 of the plunger to the discharge opening 11 serves as the discharge path 12 (see FIG. 2(f)). As still another modification, the wall surface 53 may be formed as a curved surface such that the wall is relatively thin in its central portion where the discharge path 12 is positioned (see FIG. 2(g)).

The plunger driving mechanism is, for example, an actuator that utilizes a motor, a piezoelectric element, an elastic member like a spring, air pressure, etc. The plunger driving mechanism may be constituted by using appropriate means depending on use. However, when various types of liquids ranging from a low-viscosity liquid to a high-viscosity liquid are to be discharged, it is preferable to use means capable of adjusting a stroke of the plunger over a certain range (i.e., drive means other than the piezoelectric element). When the discharge in a minute amount is performed, the plunger stroke is 5 to 1000 μm, for example. However, when the liquid having high viscosity is discharged, the plunger stroke is preferably set to a longer distance, e.g., 50 to 1000 μm.

A position of the tip portion of the plunger in its most advanced position is specified by the plunger position determining mechanism. In order to apply sufficient inertial force to the liquid material that is present ahead in the advancing direction of the plunger, a distance from an end surface of the plunger to the wall surface 53 of the liquid chamber, which faces the tip portion 31 of the plunger, is preferably set to be sufficiently short. As an inner diameter of the discharge path (nozzle) reduces, the force applied from the plunger to the liquid material needs to be increased. Thus, the distance (clearance) between the end surface of the plunger and the wall surface of the liquid chamber needs to be reduced correspondingly.

For example, to form a droplet in a diameter of 300 μm or less in the landed state with the liquid having high viscosity, the clearance is preferably set to the range of 1 to 50 μm and more preferably the range of 1 to 30 μm. However, when the liquid material contains a solid substance, such as filler, the most advanced position is set such that the clearance is larger than the solid substance. For example, when the liquid material is solder cream containing particles with a mean particle diameter of 10 μm, the clearance needs to be larger than 10 μm (preferably, the clearance is set to be 1.5 times or more the size (particle diameter) of the solid substance). This aims to avoid the problem that solder particles may be collapsed and deposited near an inlet of the discharge path, and discharge accuracy may be reduced significantly.

The plunger position determining mechanism further specifies a position of the tip portion of the plunger in its most retreated position. The reason is that when the liquid material having low viscosity is discharged, inertial force necessary to form a droplet can be applied by moving the plunger at a speed over a certain level, but the plunger stroke needs to be set to a larger distance in order to move the plunger at a higher speed when the liquid material having high viscosity is discharged. Generally, in the case of discharging a minute amount of liquid material having high viscosity (e.g., a liquid having viscosity of 10000 mPa·s or more), the plunger stroke needs to be set sufficiently larger than the clearance. The plunger stroke is preferably set to be 3 times or more, more preferably 6 times or more, and even more preferably 10 times or more the clearance at the most advanced position of the plunger.

Figure 3:
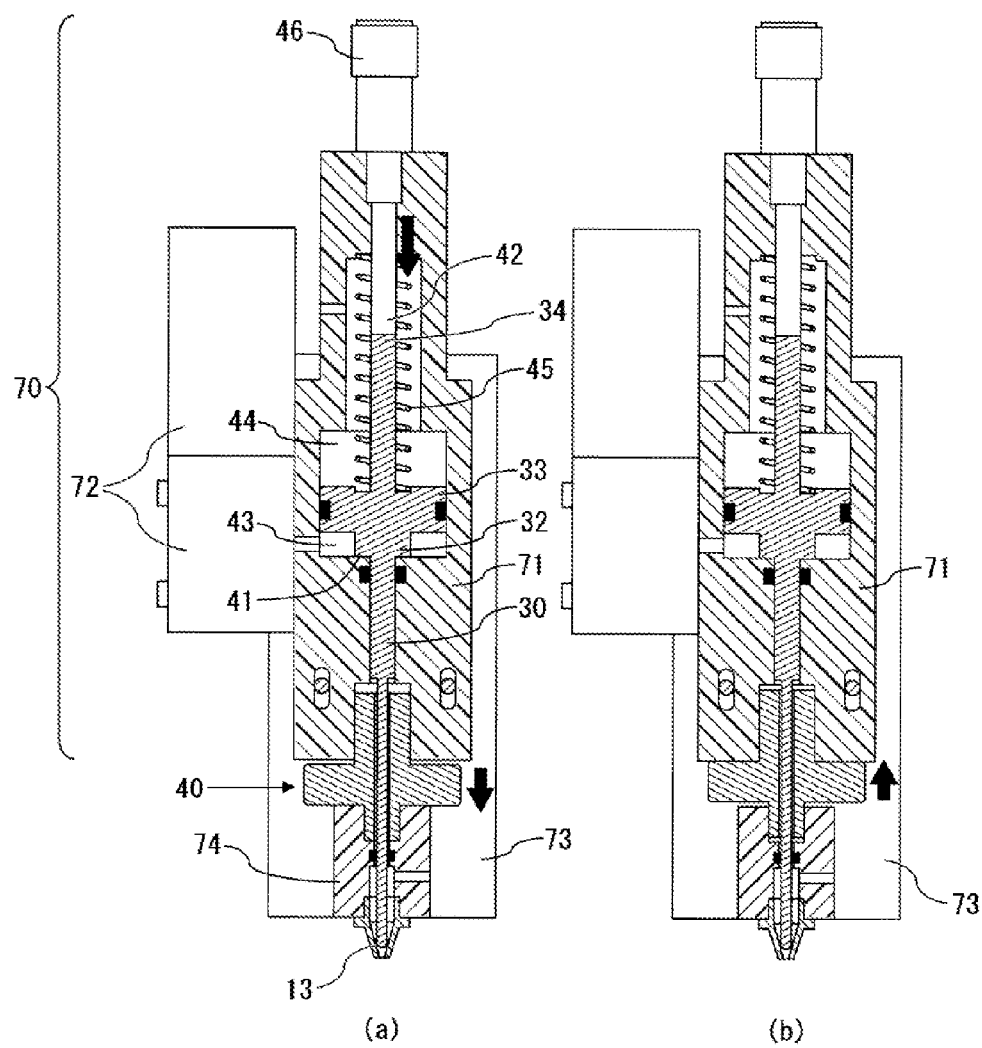
FIG. 3 is a side sectional view of the droplet discharge device including a plunger position determining mechanism. More specifically.

One example of the plunger position determining mechanism will be described below with reference to FIG. 3. The plunger position determining mechanism described below is the same as disclosed in Patent Document 2.

The most advanced position of the plunger is determined in accordance with the following procedures.

First, an electromagnetic selector valve 72 is changed over to a state where a front piston chamber 43 and the outside are communicated with each other, and a movable member 40 is moved such that the movable member 40 comes into its most advanced state. Because the front piston chamber 43 is opened to the outside, a piston 33 is moved forward relative to a body 71 by the action of a coil spring 45, and a front contact portion 32 comes into contact with a front stopper 41, whereby the piston 33 is stopped. Then, a micrometer 69 is rotated to move a rear stopper 42 forward and to make the rear stopper 42 contacted with a rear contact portion 34, whereby the plunger 30 is fixed to the body 71.

The body 71 is moved forward and is fixed in a state where the rear stopper 42 and the rear contact portion 34 are kept contacted with each other. Thus, the body 71 is stopped in a state where the tip portion 31 of the plunger 30 is located at a contact position 13 between the tip portion 31 of the plunger 30 and the inner wall of the liquid chamber 50. The movable member 40 is rotated such that only the movable member 40 is moved backward, thereby specifying the most advanced position. A driving unit 70 is then fixed to a base member 73.

Through operations described above, the most advanced position of the plunger 30 can be adjusted to a desired position at which the tip portion 31 of the plunger 30 is not contacted with the liquid chamber 50.

The most retreated position of the plunger is determined in accordance with the following procedures.

The micrometer 46 is rotated to move the rear stopper 42 backward, thus determining a distance through which the plunger 30 is to be moved backward in the discharge. After the distance through which the plunger 30 is to be moved backward has been determined, the micrometer 46 is fixed by a rotation lock member (not illustrated), e.g., a setting screw, such that the micrometer 46 will not rotate. Through operations described above, the procedures of setting the most retreated position of the plunger 30 are completed.

The droplet discharge device of the present invention is typically used in a state where the liquid material is discharged while a workpiece and the discharge opening are moved relative to each other. The droplet discharge device is mounted to an XYZ driving mechanism and is moved relative to a worktable on which the workpiece is placed. In the present invention, since the liquid is separated in the form of a droplet from the discharge opening and is landed on the workpiece, the discharge opening can be horizontally moved while it is held at a certain height.

One droplet is discharged at one operating position in some cases. In other cases, a plurality of droplets may be discharged to the same place to ensure a desired amount of the liquid material. If the discharge amount of the liquid material per shot is increased, the diameter of the landed droplet increases. Therefore, when the diameter of the landed droplet is not to be increased, it is preferable to obtain the desired amount of the liquid material with several shots. The droplet discharge device of the present invention can successively discharge the liquid at a high speed in units of minute amount. The droplet discharge device can be operated, for example, at a high tact of 100 shots or more per second.

The relation between the position of the plunger and the state of the liquid material will be described below.

FIG. 1(a) illustrates an initial state at the start of a series of discharge operations. In the initial state, the tip portion 31 of the plunger 30 is present at an operation start position at which the tip portion 31 is located farthest away from the discharge path 12 during the series of discharge operations. The liquid chamber 50 and the discharge path 12 are in a state filled with the liquid material. At that time, a portion of the discharge path 12 on the side closer to the discharge opening 11 may be in a state sucking a small amount of the atmosphere (air).

FIG. 1(b) illustrates a state where the plunger is moved forward from the operation start position of the plunger in FIG. 1(a) until the liquid material in the discharge path 12 reaches the discharge opening (i.e., the end surface of the discharge path 12 on the side close to the discharge opening).

On that occasion, with the forward movement of the plunger 30, the liquid material in the liquid chamber 50 is delivered into the discharge path 12, and the liquid material in the discharge path 12 reaches the discharge opening 11 at the end of the discharge path 12. Accordingly, the atmosphere (air) present inside the discharge path 12 is discharged to the outside.

FIG. 1(c) illustrates a state where the plunger is further moved forward from the position of FIG. 1(b). In this state, the liquid material having reached the discharge opening is pushed out of the discharge opening without being divided.

FIG. 1(d) illustrates a state where the forward movement of the plunger is stopped after further moving the plunger forward from the plunger position of FIG. 1(c). On that occasion, the liquid material is further pushed out of the discharge opening 11 at the end of the discharge path 12 without being divided over a region from the liquid chamber 50 to a foremost end of the liquid material.

It is preferable to forcibly perform the forward movement of the plunger 30 in the above-described steps, and to suddenly stop the plunger 30.

In that state, the tip portion 31 of the plunger 30 is present at its most advanced position at which the tip portion 31 is located nearest to the discharge path 12 during the series of discharge operations. With the plunger 30 moved to the most advanced position, the liquid material in an amount necessary to form a droplet of a desired size is pushed out of the discharge opening 11. While the most advanced position differs depending on the type of the liquid material and the size of the droplet to be formed, the tip portion 31 of the plunger 30 is not contacted with the inner surface of the liquid chamber in any case.

FIG. 1(e) illustrates a state where the plunger is slightly moved backward from the plunger position (most advanced position) of FIG. 1(d).

With the backward movement of the plunger 30, a proportion of the volume of the plunger occupying an inner space of the liquid chamber 50 is reduced, and force directing toward the inside of the liquid chamber 50 acts on the liquid material in the discharge path 12. Correspondingly, force further acts on the liquid material present outside the discharge opening 11 (i.e., the liquid material pushed out in continuity with the liquid material in the discharge path 12) in a direction of withdrawing the liquid material back into the discharge path 12. Therefore, the liquid material having been pushed out of the discharge opening undergoes the inertial force acting in the advancing direction of the plunger and the force acting in the retreating direction of the plunger, thus causing a droplet to start to be formed. In other words, the liquid material having been pushed out of the discharge opening 11 in continuity with the liquid material in the discharge path 12 undergoes an action of dividing the liquid material at a position near the discharge opening.

FIG. 1(f) illustrates a state where the plunger is further moved backward from the position of FIG. 1(e).

With the further backward movement of the plunger 30, the action of dividing the liquid material having been pushed out of the discharge opening 11 is further increased. As a result, the liquid material pushed out of the discharge opening 11 in the state continuing from the discharge path 12 is divided at the position near the discharge opening, whereby a droplet is formed.

In FIG. 1(f), portions of the liquid material near the division position thereof on the side continuing from the discharge path 12 and on the divided droplet side are each illustrated in the form of a thin string. Generally, a high-viscosity material is often divided in such a way of providing string-like extensions as illustrated in FIG. 1(f). However, division behaviors depend on characteristics of materials, environmental conditions such as temperature and humidity, etc., and all high-viscosity materials do not always provide the above-mentioned string-like extensions when divided.

FIG. 1(g) illustrates a state where the plunger is further moved backward from the plunger position of FIG. 1(f). The portion of the liquid material having been pushed out of the discharge opening 11 but remaining on the side closer to the discharge path 12 is sucked into the discharge path 12 with the further backward movement of the plunger 30.

To be ready for the next discharge, a region of the discharge path 12 on the side closer to the discharge opening 11 is preferably brought into a state sucking a minute amount of the atmosphere (air). In other words, it is preferable to establish a state where an air-liquid interface exists inside the discharge path 12. The presence of the air-liquid interface can prevent drying of the liquid material, and can avoid contamination of surrounding environments with liquid leakage in a state standby for the next series of discharge operations. A point to be taken care of here is that the atmosphere (air) should not be sucked into the liquid chamber 50 beyond the discharge path 12. If the atmosphere (air) is sucked into the liquid chamber 50, the discharge accuracy would be affected adversely.

Figure 2:
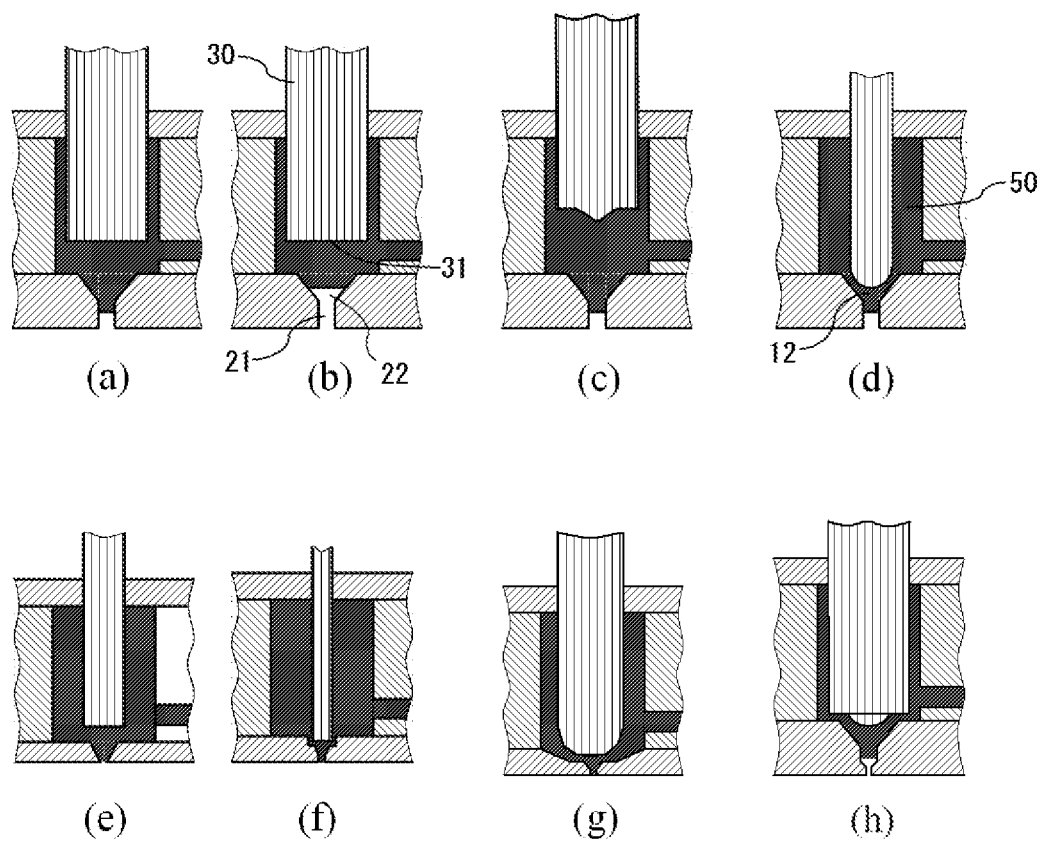
FIG. 2 illustrates examples of modified configuration of the plunger and a discharge path. More specifically.

In the case of the discharge path 12 including the first flow path 21 and the second flow path 22, when a boundary between the first flow path 21 and the second flow path 22 does not form a step, the air-liquid interface may exist in any of the first flow path 21 and the second flow path 22 or at the boundary (For example, as in the case of the flow path having the shapes illustrated in FIGS. 2(a) and 2(b)). Even when the boundary between the first flow path 21 and the second flow path 22 forms a step as illustrated in FIG. 2(f), the atmosphere (air) may be sucked into the second flow path 22 unless bubbles are formed. Additionally, the first flow path 21 having a cylindrical shape and the second flow path 22 having a cylindrical shape may be smoothly coupled to each other through a tapered boundary portion.

FIG. 1(h) illustrates a state where the plunger is further moved backward from the plunger position of FIG. 1(g) and is brought into an operation end position. FIGS. 1(a) to 1(h) represent the series of discharge operations to form one droplet. The plunger position after one series of the discharge operations is located backward of the most advanced position. In such a state, a minute amount of the atmosphere (air) is sucked into the region of the discharge path 12 on the side closer to the discharge opening 11. Even when the atmosphere (air) is sucked into the discharge path 12, the problem of bubbles does not occur unless the sucked air reaches the liquid chamber 50. If the atmosphere flows into the liquid chamber 50, this would cause variations of the discharge amount and other problems. Accordingly, the atmosphere has to be avoided from flowing into the liquid chamber 50. When continuously performing the next series of discharge operations, the operation end position of the plunger is preferably set to be the same as the operation start position.

When the discharge operations are completely ended, it is preferable to close the discharge path 12 with the tip portion 31 of the plunger 30, and to prevent the liquid material from flowing out from the discharge opening 11.

While details of the present invention will be described below in connection with Examples, the present invention is in no way limited to the following Examples.

EXAMPLE 1

A droplet was formed by the droplet discharge device illustrated in FIG. 1. The liquid material used in Example 1 was a solder paste (viscosity: 45000 mPa·s) containing filler with a mean particle size of 6 μm. A volume of one droplet discharged in this Example was 0.2 nl, and a diameter of the landed droplet was 120 μm. From a test of forming several tens of droplets on a workpiece at a tact of 100 shots per second while moving the workpiece and the discharge opening relative to each other, it was confirmed as a result of measurement using a measuring device that dots having uniform shapes were formed.

EXAMPLE 2

A droplet was formed by the droplet discharge device illustrated in FIG. 1. The liquid material used in Example 2 was an Ag paste (viscosity: 28000 mPa·s) containing flake-shaped filler in the range of 1 to 10 μm. A volume of one droplet discharged in this Example was 0.17 nl, and a diameter of the landed droplet was 100 μm. From a test of forming several tens of droplets on a workpiece at a tact of 250 shots per second while moving the workpiece and the discharge opening relative to each other, it was confirmed as a result of measurement using a measuring device that dots having uniform shapes were formed.

INDUSTRIAL APPLICABILITY

According to the present invention, high-accurate discharge in a minute amount can be realized for materials, which have so far been regarded, in the fields of electronic and semiconductor industries, to be difficult in performing discharge in the minute amount, without contacting the plunger (valve body) with the inner wall of the liquid chamber (valve seat). For example, a paste material containing a soft metallic material, such as a solder paste, can be continuously discharged without collapsing the paste material and without causing clogging in the discharge device. The present invention can be applied to a wide range of field, such as application to a process of mounting small-sized components onto a substrate, and to a process of manufacturing a solar cell.

Furthermore, since the valve body and the valve seat are not contacted with each other, friction debris or particles are not generated and hence not mixed into the material (namely, contamination-free). Therefore, the present invention can suitably be further applied to industries of foods, pharmaceuticals, and so on.

In addition, since particles, solid substances, gel-like materials, structured materials, etc., including filler, are discharged in a flying way without destroying their structures, it is possible to effectively prevent clogging of the nozzle with destroyed matters.

LIST OF REFERENCE SYMBOLS 11 discharge opening
12 discharge path
13 contact position
21 first flow path
22 second flow path
30 plunger
31 tip portion
32 front contact portion
33 piston
34 rear contact portion
40 movable member
41 front stopper
42 rear stopper
43 front piston chamber
44 rear piston chamber
45 coil spring
46 micrometer
50 liquid chamber
51 insertion hole
52 liquid feed path
53 wall surface of liquid chamber in facing relation to plunger
71 body
72 electromagnetic selector valve
73 base member
74 discharge block

The invention claimed is:

1. A droplet discharge device comprising
a discharge path having an end that constitutes a discharge opening,
a liquid chamber to which a liquid material is supplied, the liquid chamber being formed by an inner wall of an enclosure and communicating with the discharge path,
a plunger which is inserted into the liquid chamber,
a plunger driver that moves the plunger forward and backward, and
a plunger stopper that specifies a position of a tip portion of the plunger,
wherein the liquid material is discharged in a droplet state by applying inertial force to the liquid material with forward movement of the plunger in a state where the tip portion of the plunger contacts neither the inner wall of the liquid chamber nor a valve seat, and
wherein a minute droplet is formed by moving the plunger forward to push the liquid material out of the discharge opening in an amount necessary to form a droplet of a desired size, and then by moving the plunger backward to divide the liquid material having been pushed out of the discharge opening.

2. The droplet discharge device according to claim 1, wherein the discharge path includes a first flow path having an end that constitutes the discharge opening, and a second flow path, which is communicated with the first flow path and the liquid chamber, and which has a larger diameter than the first flow path.

3. The droplet discharge device according to claim 2, wherein, after moving the plunger backward and dividing the liquid material having been pushed out of the discharge opening, the plunger is further moved backward to form an air-liquid interface in the first flow path or the second flow path, and the movement of the plunger is then stopped.

4. The droplet discharge device according to claim 3, wherein the minute droplet is successively formed by moving the plunger forward from a plunger position, which is given after forming the air-liquid interface in the discharge path and stopping the movement of the plunger, to push the liquid material out of the discharge opening in an amount necessary to form a droplet of a desired size, and then by moving the plunger backward to divide the liquid material having been pushed out of the discharge opening.

5. The droplet discharge device according to claim 3, wherein an inner diameter of the discharge opening is several tens μm or less.

6. The droplet discharge device according to claim 2, wherein an inner diameter of the discharge opening is several tens μm or less.

7. The droplet discharge device according to claim 2, wherein the second flow path has a larger diameter than the plunger, and wherein the plunger is moved forward to the inside of the second path, to push the liquid material out of the discharge opening in an amount necessary to form a droplet of a desired size.

8. The droplet discharge device according to claim 1, wherein, after moving the plunger backward and dividing the liquid material having been pushed out of the discharge opening, the plunger is further moved backward to form an air-liquid interface in the discharge path, and the movement of the plunger is then stopped.

9. The droplet discharge device according to claim 8, wherein the minute droplet is successively formed by moving the plunger forward from a plunger position, which is given after forming the air-liquid interface in the discharge path and stopping the movement of the plunger, to push the liquid material out of the discharge opening in an amount necessary to form a droplet of a desired size, and then by moving the plunger backward to divide the liquid material having been pushed out of the discharge opening.

10. The droplet discharge device according to claim 1, wherein an inner diameter of the discharge opening is several tens µm or less.

11. A droplet discharge method for discharging a liquid material in a droplet state comprising:
    providing a droplet discharge device comprising
        a discharge path having an end that constitutes a discharge opening,
        a liquid chamber to which a liquid material is supplied, the liquid chamber being formed by an inner wall of an enclosure and communicating with the discharge path,
        the plunger which is inserted into the liquid chamber,
        a plunger driver that moves the plunger forward and backward, and a plunger stopper that specifies a position of the tip portion of the plunger,
    moving the plunger forward to push the liquid material out of the discharge opening in an amount necessary to form a droplet of a desired size so as to apply inertial force to the liquid material with forward movement of the plunger in a state where a tip portion of the plunger contacts neither the inner wall of the liquid chamber nor a valve seat; and
    a dividing step of moving the plunger backward to divide the liquid material having been pushed out of the discharge opening, to thereby form the minute droplet.

12. The droplet discharge method according to claim 11, wherein the droplet discharge method further includes a sucking step of, after the dividing step, further moving the plunger backward to form an air-liquid interface in the discharge path, and then stopping the movement of the plunger.

13. The droplet discharge method according to claim 12, wherein the liquid material is a liquid material containing a solid substance, and a distance between the tip portion of the plunger and the inner wall of the liquid chamber in the pushing step is set larger than the solid substance.

14. The droplet discharge method according to claim 12, wherein an inner diameter of the discharge opening is several tens µm or less.

15. The droplet discharge method according to claim 12, wherein the liquid material has viscosity of 10000 mPa·s or more.

16. The droplet discharge method according to claim 12, wherein a forward movement distance of the plunger in the pushing step is larger than a distance between the tip portion of the plunger and the inner wall of the liquid chamber immediately after the pushing step.

17. The droplet discharge method according to claim 11, wherein the liquid material is a liquid material containing a solid substance, and a distance between the tip portion of the plunger and the inner wall of the liquid chamber in the pushing step is set larger than the solid substance.

18. The droplet discharge method according to claim 11, wherein an inner diameter of the discharge opening is several tens µm or less.

19. The droplet discharge method according to claim 11, wherein the liquid material has viscosity of 10000 mPa·s or more.

20. The droplet discharge method according to claim 11, wherein a forward movement distance of the plunger in the pushing step is larger than a distance between the tip portion of the plunger and the inner wall of the liquid chamber immediately after the pushing step.

21. The droplet discharge method according to claim 11, wherein the discharge path includes a first flow path having an end that constitutes the discharge opening, and a second flow path, which is communicated with the first flow path and the liquid chamber, and which has a larger diameter than the first flow path.

22. The droplet discharge method according to claim 21, wherein the second flow path has a larger diameter than the plunger, and wherein the plunger is moved forward to the inside of the second path, to push the liquid material out of the discharge opening in an amount necessary to form a droplet of a desired size.

* * * * *